(12) United States Patent
Kim et al.

(10) Patent No.: US 9,275,714 B1
(45) Date of Patent: Mar. 1, 2016

(54) READ OPERATION OF MRAM USING A DUMMY WORD LINE

(71) Applicant: QUALCOMM Incorporated, San Diego, CA (US)

(72) Inventors: Taehyun Kim, San Diego, CA (US); Sungryul Kim, San Diego, CA (US); Jung Pill Kim, San Diego, CA (US); Xiangyu Dong, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/499,050

(22) Filed: Sep. 26, 2014

(51) Int. Cl.
*G11C 11/16* (2006.01)

(52) U.S. Cl.
CPC .......... *G11C 11/1673* (2013.01); *G11C 11/161* (2013.01)

(58) Field of Classification Search
CPC ............................... G11C 11/16; G11C 11/161
USPC .................................................. 365/158, 173
See application file for complete search history.

(56) References Cited

U.S. PATENT DOCUMENTS

| 7,489,577 | B2 | 2/2009 | Sato et al. | |
|---|---|---|---|---|
| 7,764,540 | B2 | 7/2010 | Morishita et al. | |
| 8,203,862 | B2 | 6/2012 | Chen et al. | |
| 8,274,841 | B2 | 9/2012 | Shimano et al. | |
| 8,351,253 | B2 | 1/2013 | Hidaka | |
| 8,670,269 | B2 * | 3/2014 | Kwon et al. | 365/158 |
| 8,693,273 | B2 * | 4/2014 | Yuh et al. | 365/207 |
| 9,042,153 | B2 * | 5/2015 | Chung | 365/148 |
| 2002/0087779 | A1 | 7/2002 | Zhang | |
| 2003/0061446 | A1 | 3/2003 | Lee et al. | |
| 2004/0027908 | A1 | 2/2004 | Ooishi et al. | |
| 2005/0232003 | A1 * | 10/2005 | Park et al. | 365/158 |
| 2007/0247939 | A1 * | 10/2007 | Nahas et al. | 365/208 |

OTHER PUBLICATIONS

International Search Report and Written Opinion—PCT/US2015/049229—ISA/EPO—Dec. 1, 2015.

* cited by examiner

*Primary Examiner* — Michael Tran
(74) *Attorney, Agent, or Firm* — Muncy, Geissler, Olds & Lowe, P.C.

(57) ABSTRACT

Systems and methods relate to a read operation on a magnetoresistive random access memory (MRAM). Prior to determining whether there is a hit in the MRAM for a first address corresponding to the read operation, a dummy word line is activated, based on at least a subset of bits of the first address. A settling process for a reference voltage for reading MRAM bit cells at the first address is initiated, based on dummy cells connected to the dummy word line and a settled reference voltage is obtained. If there is a hit, a first word line is activated based on a row address determined from the first address, and the MRAM bit cells at the first address are read using the settled reference voltage.

21 Claims, 14 Drawing Sheets

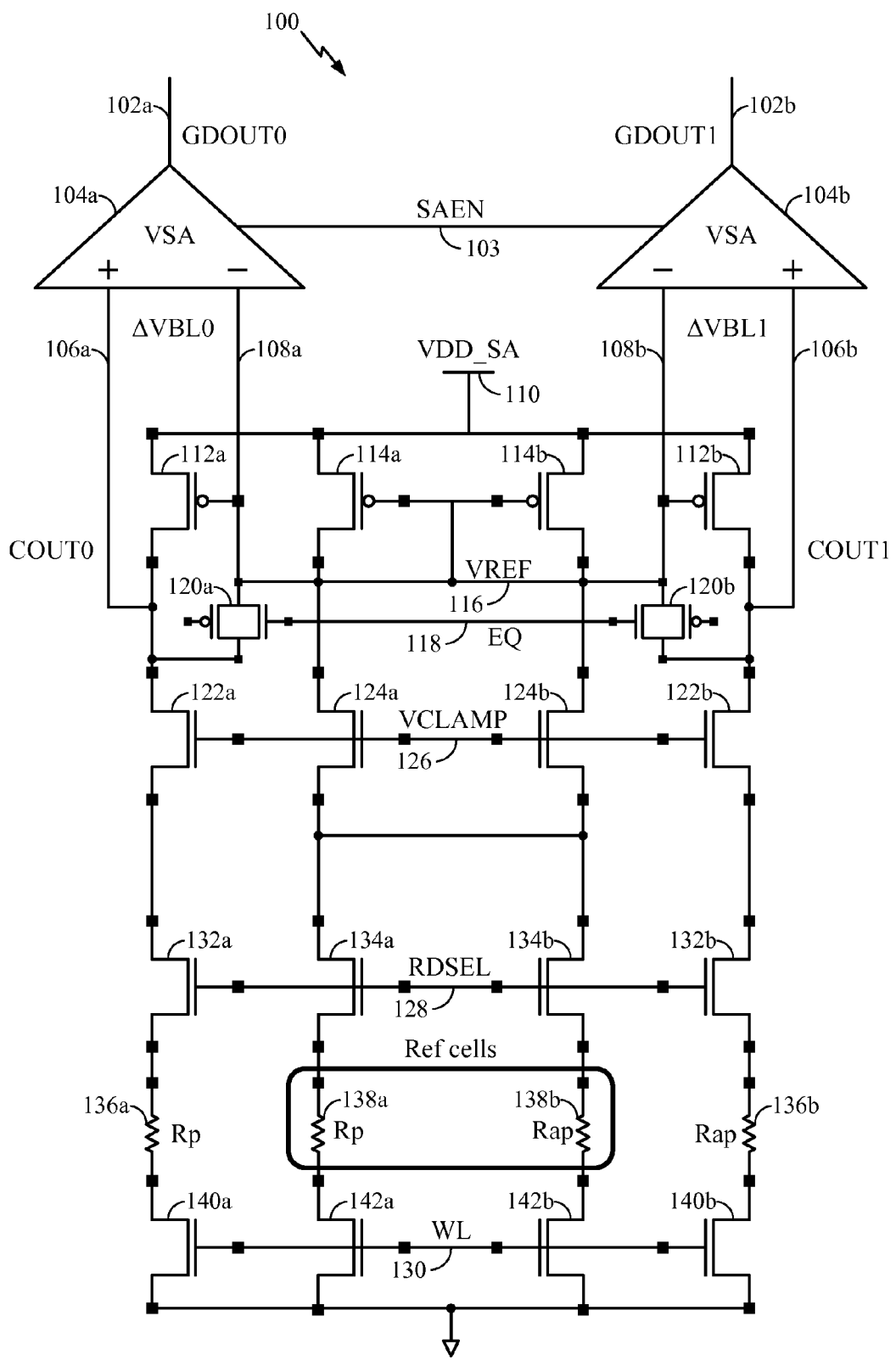
CONVENTIONAL
FIG. 1A

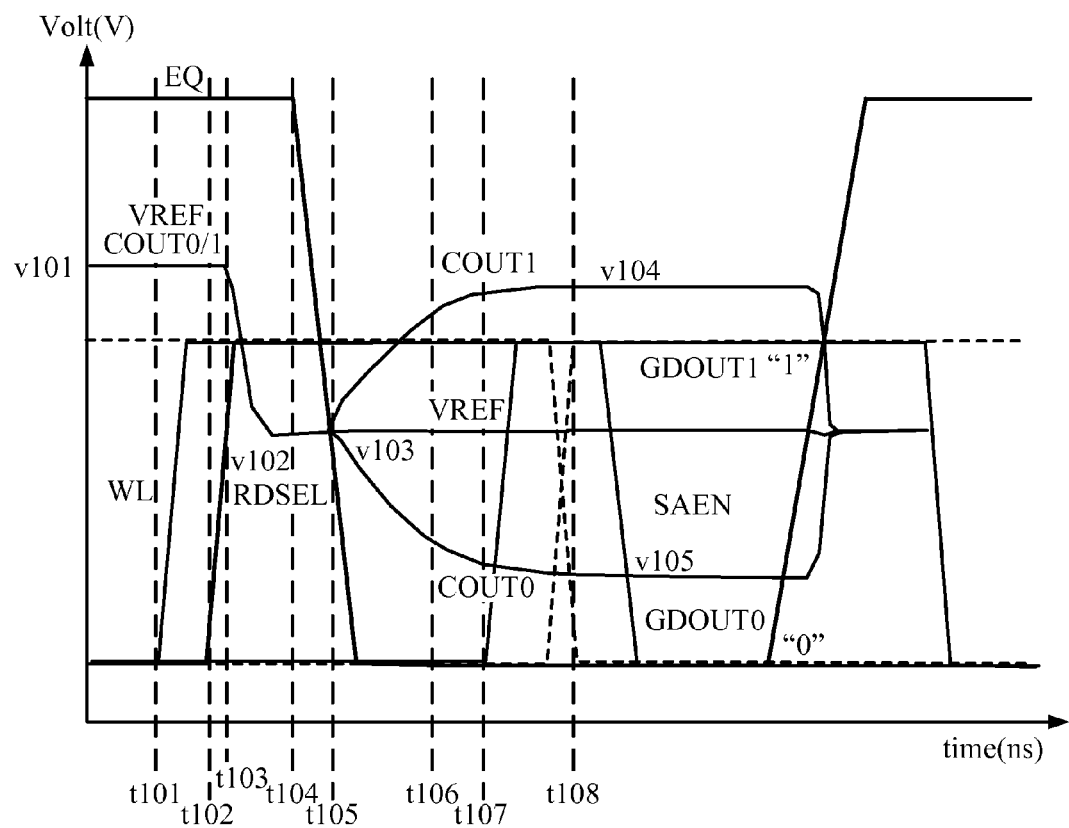
CONVENTIONAL
FIG. 1B

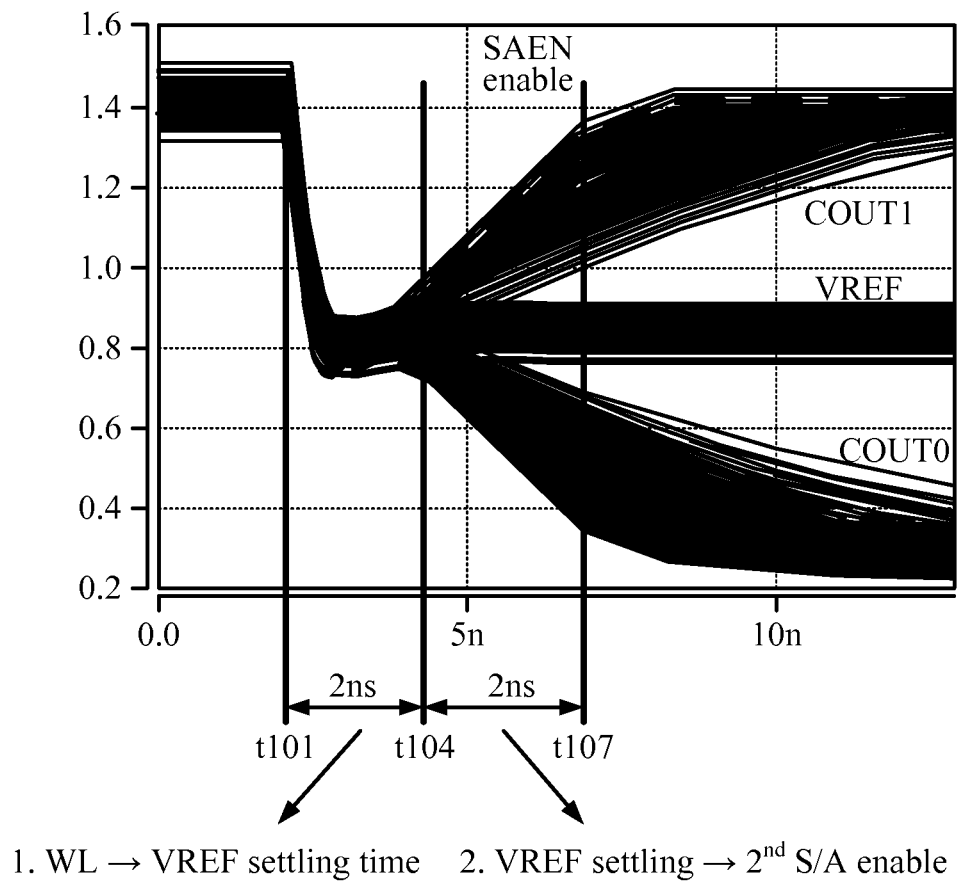
CONVENTIONAL
FIG. 1C

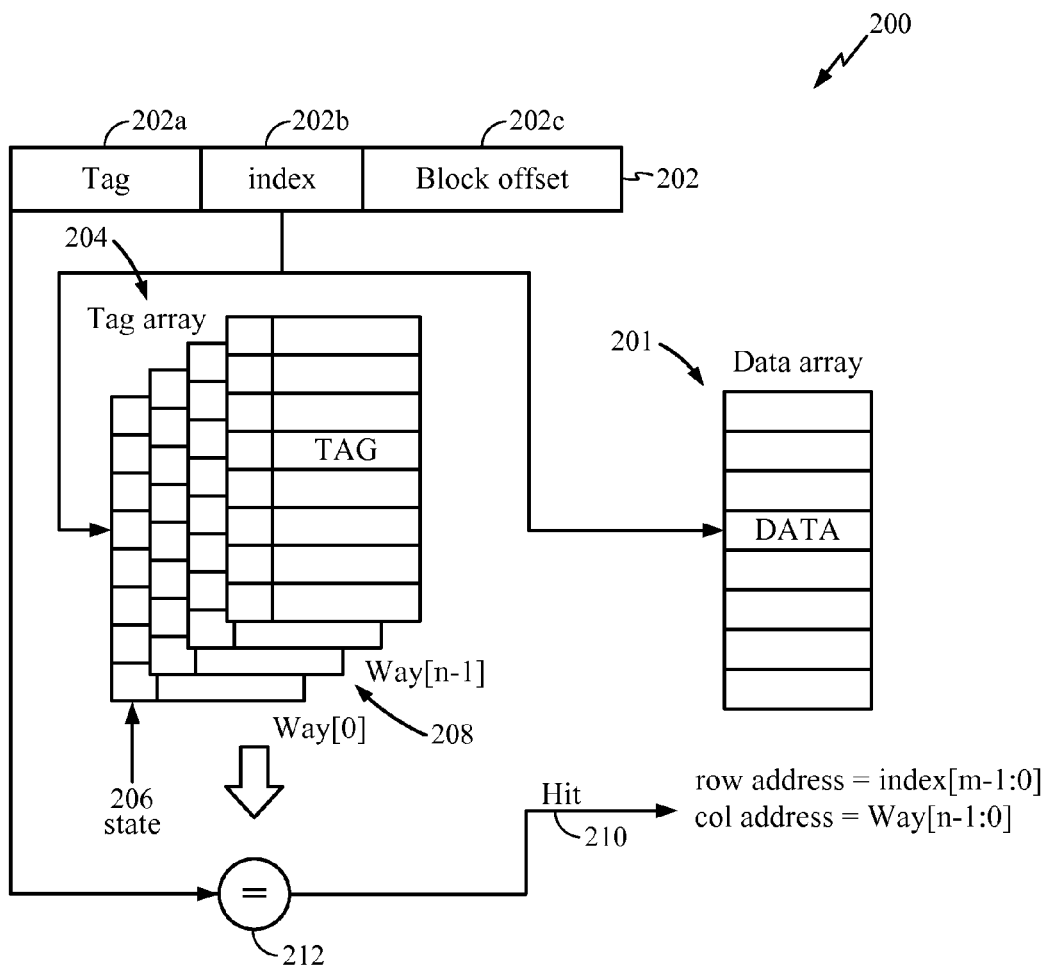
CONVENTIONAL
FIG. 2A

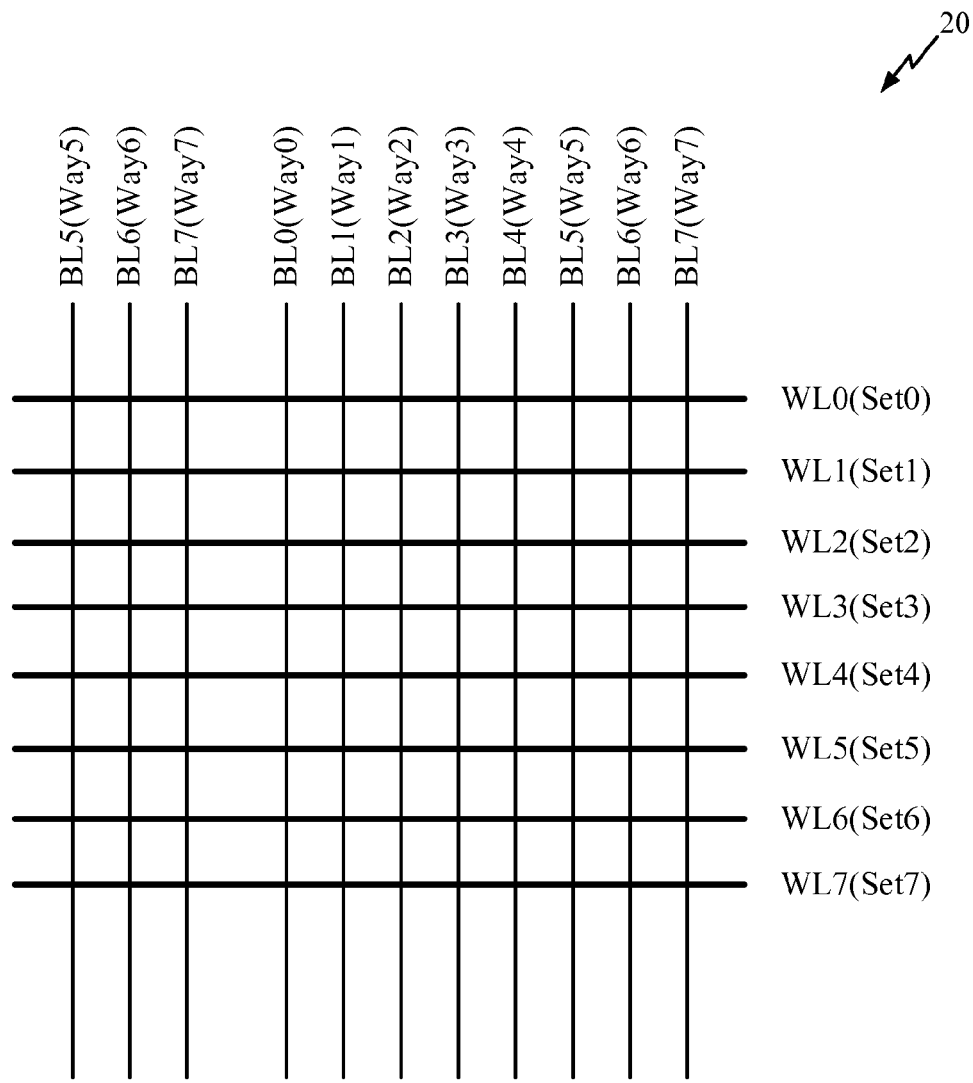
8 way set associative cache
array structure
BL = way_addr[2:0]
WL = set_addr[9:0]
CONVENTIONAL
FIG. 2B

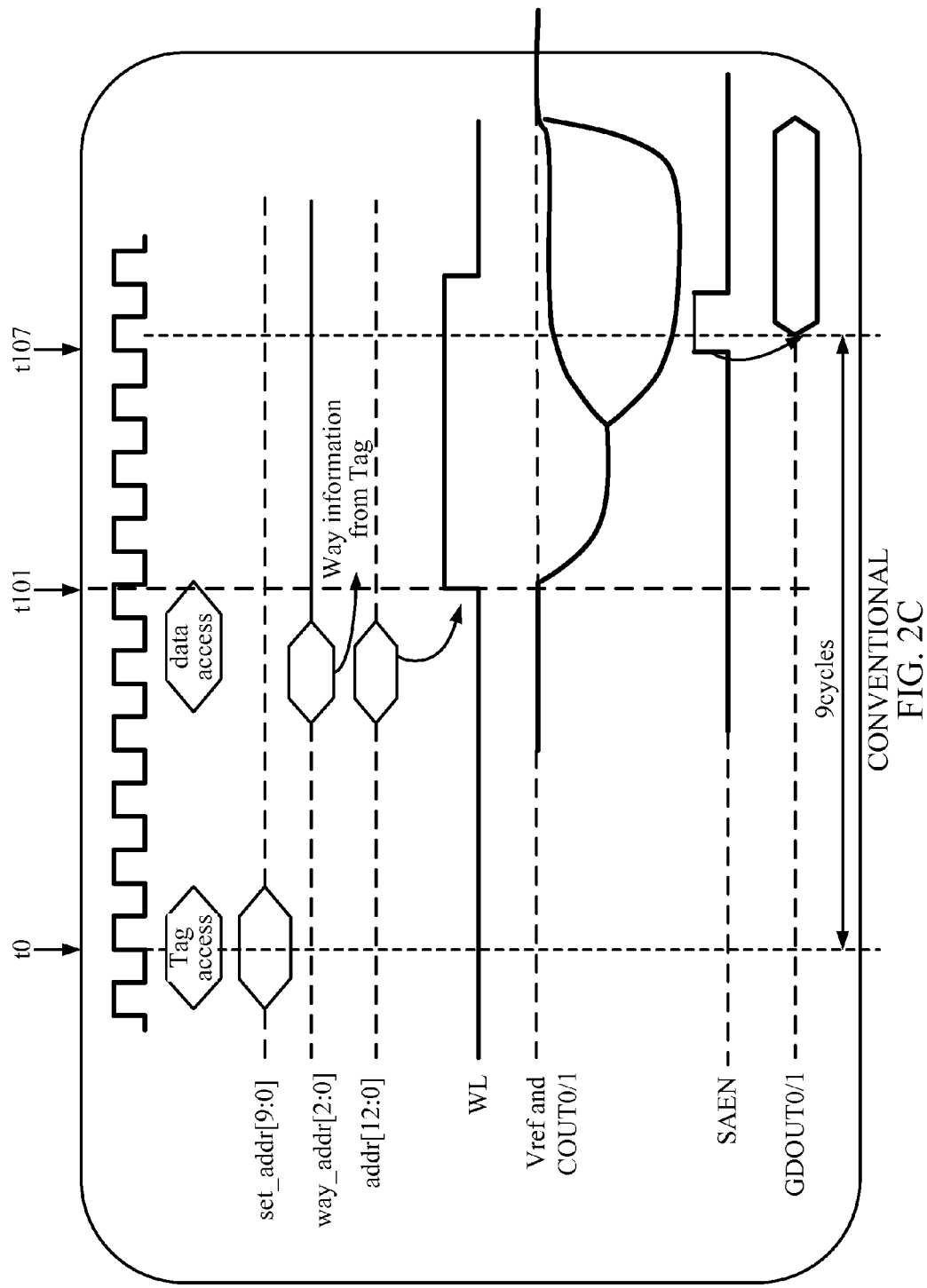
CONVENTIONAL
FIG. 2C

READ OPERATION OF MRAM USING A DUMMY WORD LINE

FIELD OF DISCLOSURE

Disclosed aspects are directed to accelerating read operations on magnetoresistive random access memory (MRAM). More particularly, exemplary aspects are directed to activating a dummy word line to initiate and accelerate a settling process for a reference voltage for reading bit cells of a row, prior to determining whether there is a hit for the row in the MRAM.

BACKGROUND

Magnetoresistive random access memory (MRAM) is a non-volatile memory technology where data is stored based on magnetization polarities of bit cells. In contrast to conventional RAM technologies which store data as electric charges or current flows, MRAM uses magnetic elements. A magnetic tunnel junction (MTJ) which is conventionally used as a storage element or bit cell for MRAM technology, can be formed from two magnetic layers, each of which can hold a magnetic moment, separated by an insulating (tunnel barrier) layer. Conventionally, the fixed layer is set to a particular polarity. The free layer's polarity is free to change to match that of an external magnetic field that can be applied. A change in the polarity of the free layer will change the resistance of the MTJ bit cell. For example, when the magnetization polarities are aligned or "parallel," a low resistance state exists, which corresponds to a logical "0". When the magnetization polarities are not aligned or are "anti-parallel," a high resistance state exists, which corresponds to a logical "1".

While the MRAM offers many benefits in terms of cost and area, the read access speeds for MRAM remain significantly lower than the read access speeds for conventional non-volatile memories such as static random access memory (SRAM). The read process for an MRAM generally involves determining the resistance of a particular bit cell. The resistance of a bit cell is variable, based on the alignment of the free layer and the fixed layer of an MTJ bit cell as noted above. A same or similar current is passed through an MTJ bit cell as well as a reference cell of known resistance, where the reference cell is usually set to a resistance which corresponds to a mid-way resistance between that of a logical "1" and a logical "0". The voltage developed across the MTJ bit cell is compared to the voltage developed across the reference cell. A higher voltage across the MTJ bit cell implies that the data stored in the MTJ is "1" and a lower voltage across the MTJ bit cell implies that the data stored in the MTJ is "0." The above general process is explained in further detail with reference to FIG. 1 below.

FIG. 1 illustrates a conventional MRAM system 100 which includes MTJ bit cells 136a and 136b of variable resistance. MTJ bit cells 136a-b are addressable by a particular row and column address. MTJ bit cells 136a-b belong to a row which is selected when word line WL 130 is high. MTJ bit cells 136a-b are one of several MTJ bit cells (not shown) on the same row, and as such, column muxes (not shown) are used to select MTJ bit cells 136a-b from within the row. For this column selection, the control signal read select RDSEL 128 is used, which is based on the column address for MTJ bit cells 136a-b. In conventional designs, WL 130 is asserted first as the row address can be decoded faster. RDSEL 128 is asserted after a time delay following the assertion of WL 130 as it takes longer in conventional designs to decode the column address.

In the illustrated example in FIG. 1, MTJ bit cell 136a is shown to have a resistance corresponding a parallel alignment and has a logical "0" stored therein, and MTJ bit cell 136b holds a resistance corresponding to an anti-parallel alignment and has a logical "1" stored therein. Reference cells Rp 138a and Rap 138b are provided, which are MTJ bit cells programmed to known resistance/logical values of "0" and "1" respectively. Reference cells Rp 138a and Rap 138b, when coupled in parallel generate to generate an effective resistance, say Rref.

A read operation for MRAM system 100 is now discussed with reference to the timeline provided in FIG. 1B. Signal voltage values are shown on the Y-axis and time is shown on the X-axis. Word line WL 130 is asserted at time t101, which turns on n-channel metal oxide semiconductor (NMOS) transistors 140a-b and 142a-b. After a time delay, read select RDSEL 128 is asserted at time t102, which turns on NMOS transistors 132a-b and 134a-b. In order to ensure that the resistances (data values) stored in MTJ bit cells 136a-b are sensed correctly and compared with the equivalent resistance Rref of the reference cells, the read operation begins by equalizing all nodes. Particularly, equalization signal 118 is turned on before commencing the read operation (e.g., at time 0), which turns on the equalization/pass transistors 120a and 120b, which remain on until equalization signal 118 is deactivated at time t104.

The signal VGCLAMP 126 (not shown in FIG. 1B) when turned on, causes NMOS transistors 122a-b and 124a-b to be turned on, which supplies the same current through MTJ bit cells 136a-b and the reference cells Rp 138a and Rap 138b. The gate terminals of load p-channel metal oxide semiconductor (PMOS) transistors 114a-b are connected to their respective drain terminals in order to form diodes, which creates a voltage Vref at node 116. This voltage Vref 116 is based on the effective resistance Rref. On the other hand, load PMOS transistors 112a and 112b generate voltages at nodes COUT0 106a and COUT1 106b based on the resistances of MTJ bit cells 136a and 136b respectively. Initially, Vref 116 and COUT0/1 106a-b are equalized to an initial voltage value v101 based on equalization signal 118 being asserted. Once RDSEL 128 is asserted, at time t103, Vref 116 and COUT0/1 106a-b start to change and move closer to a midpoint voltage value v102. At time t104, equalization signal 118 is deactivated. At this time, Vref will reach its reference value of v103, based on the current flowing through Rref and the diode created at PMOS load transistors 114a-b. The voltage at COUT0 106a will start to voltage v105 which is lower voltage than v103 due to the lower resistance corresponding to the logical "0" stored in MTJ bit cell 136a. Similarly, COUT1 106b will increase to voltage v104 which is a higher voltage than v103 due to the higher resistance corresponding to the logical "1" stored in MTJ bit cell 136b.

At time t107, voltage sense amplifiers (VSAs) 104a and 104b are enabled by sense amplifier enable signal SAEN 103. VSAs 104a-b are used to amplify the above voltage differences $-\Delta V1 = v103 - v105$ and $+\Delta V2 = v104 - v103$. The amplified voltage differences lead to sensing the logical value stored in the MTJ bit cells 136a and 136b as "0" and "1" respectively at output nodes GDOUT0 102a and GDOUT1 102b at time t108.

With reference to FIG. 1C, an example simulation of sample signals during a read operation on MRAM system 100 is depicted. With combined reference to FIGS. 1B-C, it is seen that it takes a time delay from when WL 130 is asserted at time t101 to when Vref 116 settles to voltage v103 at time t105. This settling time is required for Vref 116 to be stable and provide a correct reference for sensing the resistance values stored in MTJ bit cells 136a-b. This settling time is shown to be as high as 2 ns in FIG. 1C. It takes an additional time after time t105 till time t107, where SAEN 103 is asserted and eventually GDOUT0/1 102a-b generate stable read values of "0" and "1" respectively. In FIG. 1C, this time taken from the settling of Vref 116 at time t104 to time t107 when SAEN 103 is asserted is also shown to be 2 ns. Thus, it is seen that it takes approximately the same amount of time to sense the data stored in the MTJ bit cells after Vref settles, as the time it takes for Vref to settle from when WL 130 is asserted.

Accordingly, the Vref settling time (e.g., t104-t101) is a major contributor to the read access time for MRAM system 100. In comparison, SRAM systems do not require a similar Vref settling time for reading SRAM bit cells. In general MRAM read access speed is slower than that of SRAM. The Vref settling time further deteriorates the MRAM read access speeds. Accordingly, there is a need to improve the read access speeds for MRAM systems.

SUMMARY

Exemplary aspects are directed to read operations on a magnetoresistive random access memory (MRAM), based on initiating and accelerating a process of obtaining a settled reference voltage for reading MRAM bit cells, prior to determining whether there is a hit in the MRAM for the read operation.

For example, an exemplary aspect is directed to a method of performing a read operation on a magnetoresistive random access memory (MRAM), the method comprising: prior to determining whether there is a hit in the MRAM for a first address corresponding to the read operation, activating a dummy word line based on at least a subset of bits of the first address, obtaining a settled reference voltage for reading MRAM bit cells of the MRAM at the first address, based on the dummy word line, and if there is a hit, reading the MRAM bit cells at the first address, using the settled reference voltage.

Another exemplary aspect is directed to an apparatus comprising: a magnetoresistive random access memory (MRAM), logic configured to activate a dummy word line based on at least a subset of bits of a first address corresponding to a read operation on MRAM bit cells at the first address, before it is determined whether there is a hit in the MRAM for the first address, logic configured to obtain a settled reference voltage for the read operation on the MRAM bit cells, based on the dummy word line, and logic configured to perform the read operation on the MRAM bit cells using the settled reference voltage if there is a hit.

Yet another exemplary aspect is directed to a system comprising a magnetoresistive random access memory (MRAM), means for activating a dummy word line based on at least a subset of bits of a first address corresponding to a read operation on MRAM bit cells at the first address, before it is determined whether there is a hit in the MRAM for the first address, means for obtaining a settled reference voltage for the read operation on the MRAM bit cells, based on the dummy word line, and means for performing the read operation on the MRAM bit cells using the settled reference voltage if there is a hit.

BRIEF DESCRIPTION OF THE DRAWINGS

The accompanying drawings are presented to aid in the description of embodiments of the invention and are provided solely for illustration of the embodiments and not limitation thereof.

FIG. 1A illustrates a circuit diagram for a conventional MRAM system.

FIGS. 1B-C illustrate timing diagrams for read operations on a conventional MRAM system.

FIGS. 2A-B illustrates a schematic for a read operation on a conventional set-associative cache.

FIG. 2C illustrates a timing diagram corresponding to the read operation of a conventional set-associative cache comprising a MRAM.

DETAILED DESCRIPTION

Figure 3A:
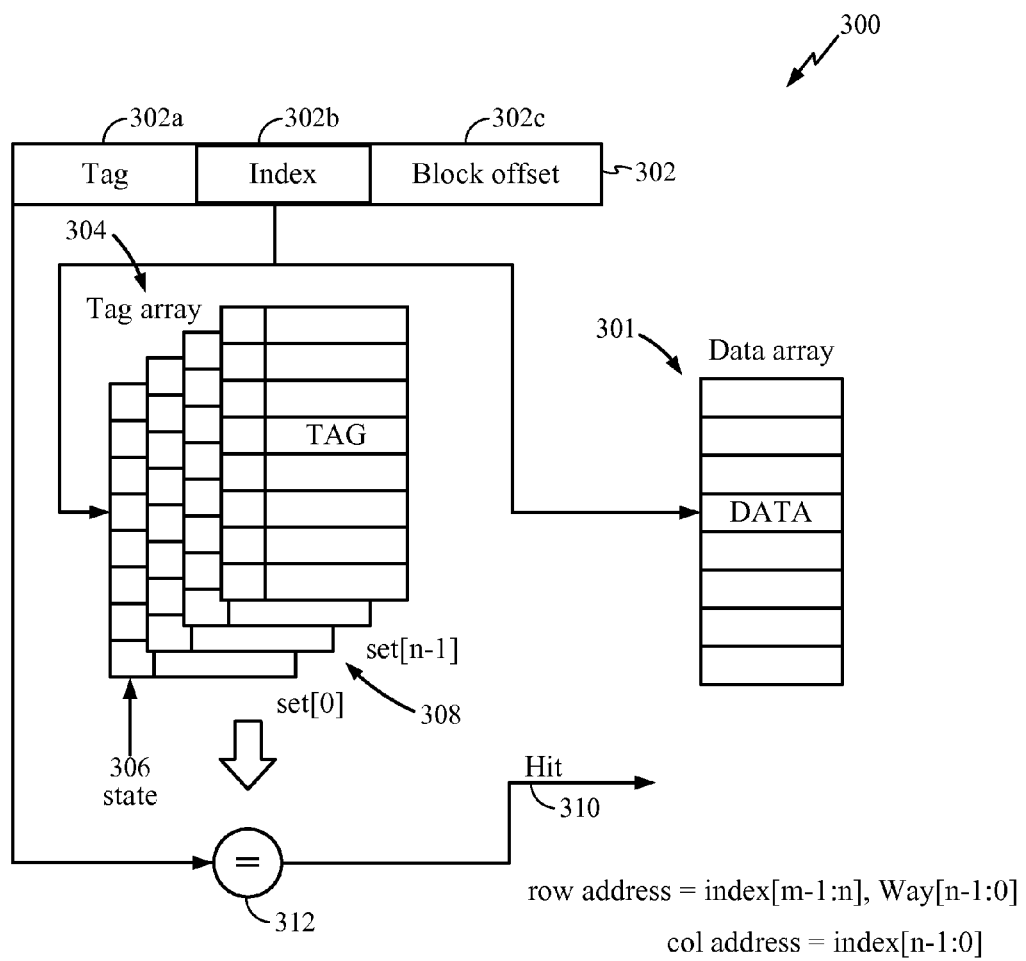
FIGS. 3A-B illustrate an exemplary set-associative cache comprising MRAM, configured for improved read access speed according to aspects disclosed herein.

Aspects of the invention are disclosed in the following description and related drawings directed to specific embodiments of the invention. Alternative embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary aspects are directed to reducing the read access speed for MRAMs using a dummy word line. Since settling time for Vref 116 in the aforementioned conventional MRAM system 100 depends on when word line 130 gets asserted, in exemplary aspects, a dummy word line is used to initiate the process of Vref settling. Thus, rather than wait for row address decoders to generate word line 130 at time t101, for example, a dummy word line is asserted earlier. The dummy word line causes triggers the Vref settling process, and by the time the correct word line (e.g., WL 130 in MRAM system 100) is asserted, Vref may already be settled and ready to provide a stable reference for the read operation to follow. Thus, the contribution of Vref settling time towards MRAM read access speed can be minimized or effectively eliminated, which improves the MRAM read access speeds in exemplary aspects.

In order to provide the dummy word line, exemplary aspects relate to modifying the process by which a memory access address is used to generate row and column addresses for reading a set of one or more bit cells in a memory array. In order to explain the exemplary process, a brief description of memory access will now be provided.

Conventionally, memory devices such as caches may be configured with different replacement policies for cache entries. In a direct mapped cache, each cache entry can only be stored in one location, and thus, while locating a cache entry may be easy, the hit rate may be low. In a fully associative cache, a cache entry can go anywhere in the cache, which means that the hit rate may be high, but it may take longer to locate a cache entry. A set-associative cache offers a compromise between the above two replacement policies. In a set-associative cache, a cache entry can go in one of "n" places in the cache, which are also referred to as n ways. To locate a cache entry in an n way set-associative cache, an "index" or a subset of low order bits of a memory address for the cache entry are used and each of the n ways are searched for this index. The search through the n ways is in parallel. If there is a hit in one of the n ways, then the cache entry is accessed from the hitting way. If all the n ways miss, then there is a cache miss.

The above process is explained in further detail with reference to FIG. 2A. In FIG. 2A, a schematic diagram for a conventional set-associative cache 200 is shown, which includes tag array 204 and data array 201. Data array 201 can include MRAM or MTJ bit cells, such as in MRAM system 100. A read operation on cache 200 is performed using a read address. In FIG. 2A, the read address is shown as address 202. Address 202 is broken up into multiple fields including a tag field (tag 202a), an index field (index 202b), and an offset field (block 202c). Tag 202a includes a subset of the most significant address bits and block offset 202c includes a subset of the least significant address bits. Since data may be stored and addressed in bytes, for example, block offset 202c is used to address individual bits within each byte of data. Index 202b can exclude these least significant block offset 202c bits in order to search for a particular data byte, for example. Index 202b points to a row of tag array 204, which is compared with tag 202a to determine if there is a hit. State 206 includes information about whether a particular entry of data array 201 is valid/dirty, etc.

In order to access cache 200 for data corresponding to address 202, tag array 204 is first searched to determine if there is a hit, and if there is, the location of the desired data within data array 201 is determined. Since cache 200 is set-associative, tag array 204 comprises n ways 208. Index 202b provides a particular row address, which points to a particular row in each of the n ways 208. The data values stored in each of the n ways 208 at that particular row are compared with tag 202a in comparison block 212. If the data value at the particular row in one of the n ways 208 match tag 202a, then there is a hit (hit 210). The particular way of the n ways 208 which included the particular row which generated hit 210 is then determined. Following this, data array 201 is accessed with address 202 (assuming the corresponding state 206 shows that the cache entry is in a valid state). In this regard, index 202b is used to generate a row address in data array 201 and the way 208 which generated the hit, provides the column address.

In FIG. 2B, a section of data array 201 comprising selected words and columns is illustrated for a particular example where cache 200 is an 8-way set-associative cache. The column addresses which are derived from the ways are representatively shown to drive bit lines BL0-7. Similarly, the row addresses which are provided by index 202b (also referred to as a "set address") are representatively shown to drive word lines WL0-7. In conventional set-associative cache 200, column addresses for adjacent bit lines BL0-7 are cycled through the 8-ways. A same input/output (IO) port may be used for a set of 8 bit lines BL0-7 from the 8 ways, Way0-7. Correspondingly, the word lines WL0-7 are cycled through the 8 sets, Set0-7.

Coming now to FIG. 2C, the above process for determining the row and column addresses are related to the MRAM read process described in FIGS. 1A-C, using the like reference numerals for signals and time instances for ease of explanation. In FIG. 2C, access of tag array 204 with address 202 is commenced at time t0. Determining whether there is a hit in tag array 204 and then eventually generating hit 210 is a prerequisite to generating the row and column addresses in the illustrated conventional design. Thus, word line WL is asserted at time 101 following hit 210 being generated, which is several clock cycles after time t0. Referring back to FIG. 1B, for example, the read process requires until time t107 for outputs COUT0/1 to settle after Vref settling time and for SAEN to be enabled. The read is finally complete to obtain data values stored in the selected bit cells on outputs GDOUT0/1, nearly nine clock cycles after tag array 204 is first accessed at time t0.

However, exemplary aspects speed up the time from t0 to t107, for example in FIG. 2C by advancing the time when a word line goes high to trigger the process of Vref settling. For this, the process of accessing the cache is altered. A dummy word line is enabled sooner than an actual hit is generated and the actual word line for a memory access is known. The process of Vref settling is initiated based on the dummy word line being enabled. This exemplary process is now discussed in the following sections.

With reference to FIG. 3A, set-associative cache 300 is illustrated, which is similar in many aspects to cache 200 of FIG. 2A. Cache 300 includes data array 301 which comprises MRAM bit cells, or in other words, an MRAM array is integrated in data array 301. An exhaustive description of similar features between these two caches will be avoided for the sake of brevity. Briefly, cache 300 is also set-associative and address 302 comprising fields tag 302a, index 302b, and block offset 302c are used to access tag array 304 to determine whether associated data is present in data array 301. Once again, tag array 304 is organized into n ways 308 and index 302b is used to determine whether any of the n ways 308 hit, for example, for a first address corresponding to a read operation. If state 306 of the hitting entry is valid, tag 302a is compared with the corresponding field in the hitting entry of the hitting way to generate hit 310.

However, departing from the scope of conventional cache 200, in cache 300, at least a subset of bits of the first address, such as a first portion of index 302b (high order bits) are combined with the way number of the way which delivered the hit to generate the row address for data array 301. Moreover, the column address is formed by a second portion of index 302b (low order bits). Further, access of data array 301 is commenced before hit 310 is determined, as will now be explained with reference to FIGS. 3B-C.

Figure 3B:
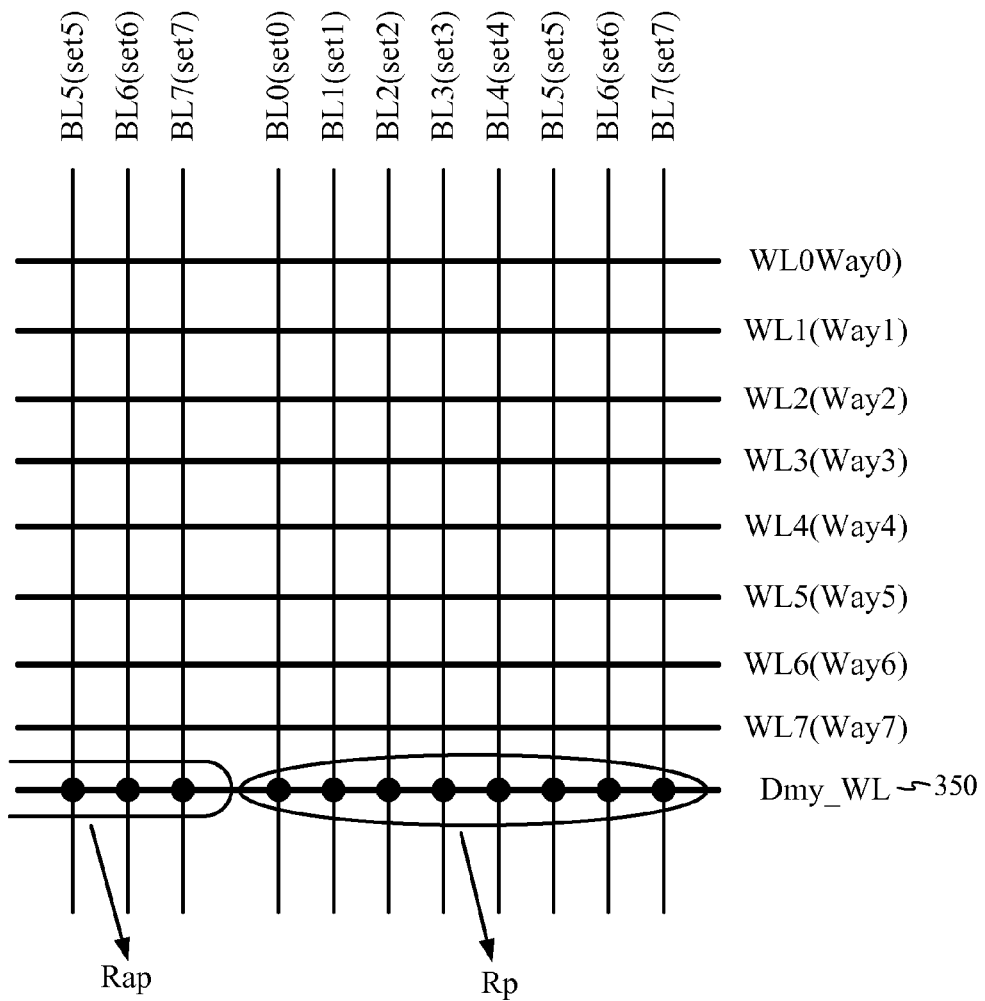

In FIG. 3B, a section of data array 301 comprising selected words and columns is illustrated for a particular example where cache 300 is an 8 way set-associative cache. In contrast to FIG. 2B, the row addresses are based on the way number (in addition to the first portion or high order bits of index 302b), are representatively shown to drive word lines WL0-7. Additionally a dummy word line 350 is added, which is configured to be asserted based on the first portion of index 302b. This means that before the particular way number is known, the word line can be any one of WL0-7. All these word lines WL0-7 share the subset of bits of the first address, i.e., the same first portion of index 302b. Dummy word line 350 will thus be asserted when any one of WL0-7 can be the correct word line. The column addresses are provided by the second portion or low order bits of index 302b (also referred to as a "set address"), which are representatively shown to drive bit lines BL0-7. Thus, in cache 300, column addresses for adjacent bit lines BL0-7 are cycled through 8 sets, Set0-7 and. A same input/output (IO) port may be used for a set of 8 bit lines BL0-7 from the 8 sets Set0-7. Correspondingly, the word lines WL0-7 are cycled through the 8 ways, Way0-7. Dummy word line 350 may be common to all bit lines which share the same IO port, for example. Thus, dummy word line 350 may be common two or more rows, such as, BL0-7 from set0-7, and may drive a set of pre-programmed dummy cells (e.g., set to resistance Rp). For another set, the dummy cells may be set to Rap, for example. The dummy cells will be explained further with reference to FIG. 4A.

Figure 3C:
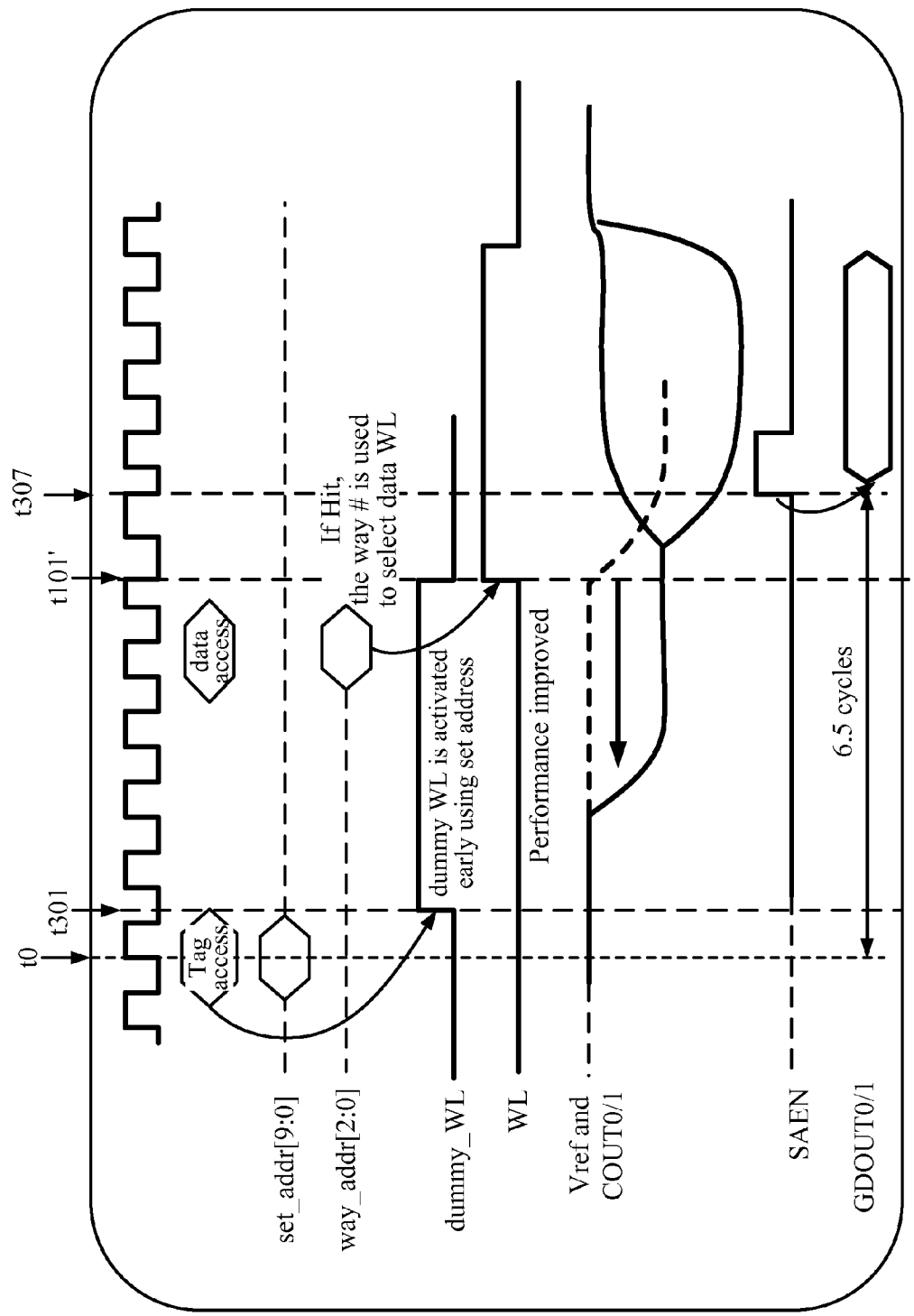
FIGS. 3C-D illustrate timing diagrams corresponding to the exemplary set-associative cache of FIGS. 3A-B.

Coming now to FIG. 3C, the effect of the above modified association of address bits with row and column addresses of data array 301 is illustrated. In FIG. 3C, access of tag array 304 with address 302 is commenced at time t0. However, in this case, a hit is assumed (the case where this assumption may be incorrect will be dealt with later). The bits of index 302b are known at this time, and thus, dummy word line 350 can be activated or asserted using the first portion or high order bits of index 302b at time t301. The reference voltage Vref is activated based on dummy cells (further explained in following sections) which are connected to dummy word line 350. This means that the process of Vref settling is started earlier, merely based on the dummy word line activation, rather than waiting for confirmation of a hit, followed by determination and activation of the correct word line address (which happens later, at time t101' in FIG. 3C). Since Vref is activated earlier, Vref is already settled to provide a settled reference voltage, by time t101' when hit 310 is determined and the correct word line is asserted. Thus, the times taken for settling of the nodes Vref and COUT0/1 are reduced. The dummy word line can be disabled once the correct way is determined and the correct word line is asserted at time t101'. The output read data GDOUT0/1 is also available soon thereafter (merely 6.5 cycles after time t0, in contrast to the 9 cycles required in the case of conventional designs shown in FIG. 2C). Thus, based on the use of the dummy word line to mask the Vref settling process, exemplary aspects can speed up the read process for an MRAM array integrated in data array 301.

As will be recalled, the above exemplary read process is based on the assumption that there will be a hit in the cache, and thus, the read process is started prior to determining a hit and if there is a hit, where exactly the hitting entry will be located within the cache. However, there is a possibility that there may be a miss. Asserting dummy word line 350 is performed at time t301 before it is known whether there will be a hit or a miss. The case of a miss will be explained with reference to FIG. 3D.

Figure 3D:
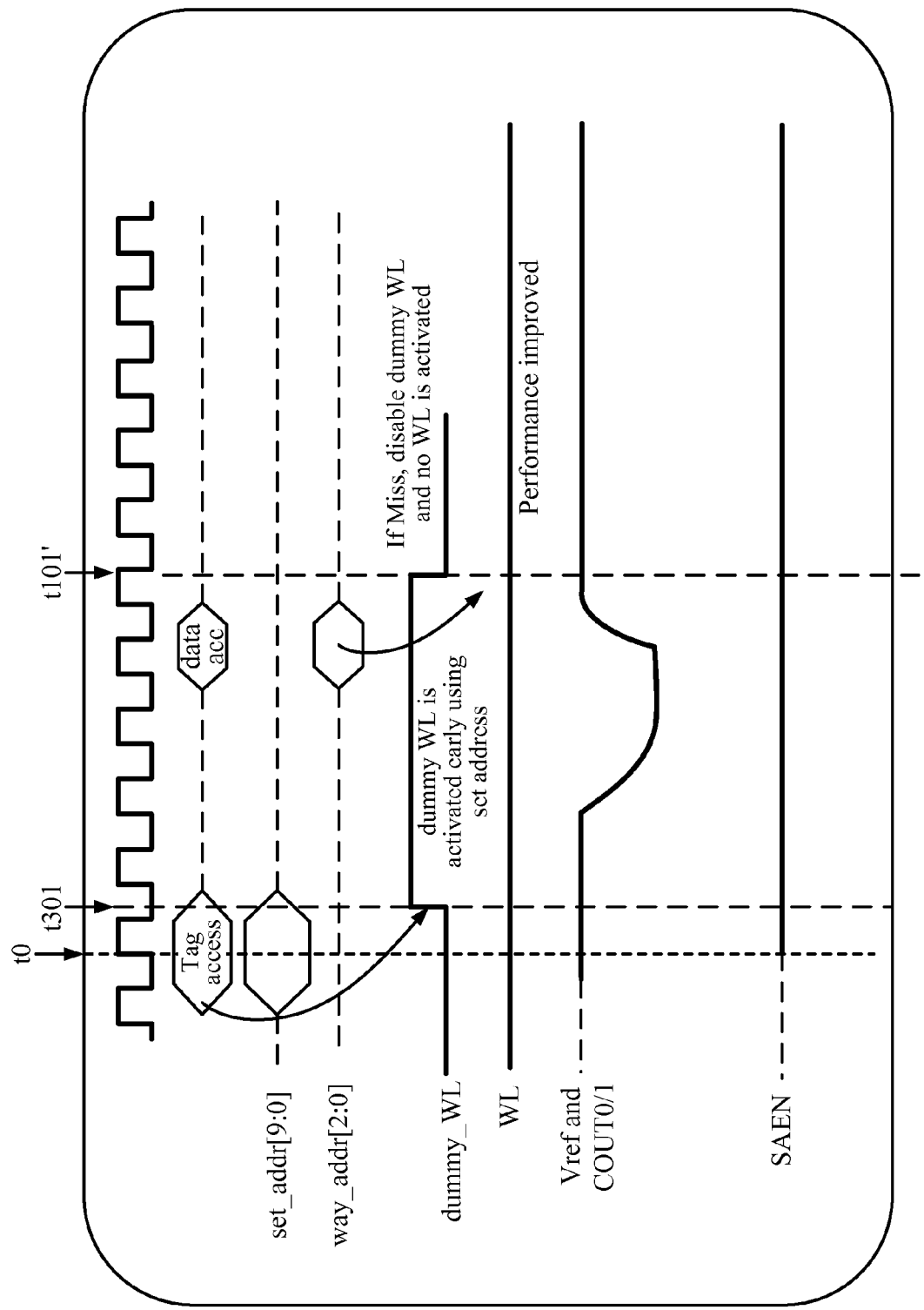

In FIG. 3D, it is seen that the dummy word line is asserted at time 301 just like in FIG. 3C. However, in this case, at time t101, following hit 310 not being asserted (i.e., indicating there was a miss), none of the word lines will be activated. Accordingly, at this time, the dummy word line is deactivated and activation of the word lines is avoided. The attempted read operation on cache 300 is complete at this stage. It will be understood that the read operation may proceed to check a next cache level or main memory, but those actions are beyond the scope of this disclosure. With continued reference to FIG. 3D, it is also seen that Vref and COUT0/1 may begin settling based on the dummy word line being asserted at t301. However, they will be reset to their initial states following hit 310 indicating a miss. Thus, in the case of a miss, only the dummy word line is asserted in false anticipation of a hit, but no other bit cells are disturbed. The SAEN signal also remains off, so the sense amplifiers are not enabled, thus preventing unnecessary power consumption.

The exemplary aspects of adding a dummy word line to speed up the read access may involve dummy cells to be activated, rather than the data cells which store data. Adding such dummy cells is described by revisiting MRAM system 100 of FIG. 1A with the modifications for the exemplary dummy cells included.

Figure 4A:
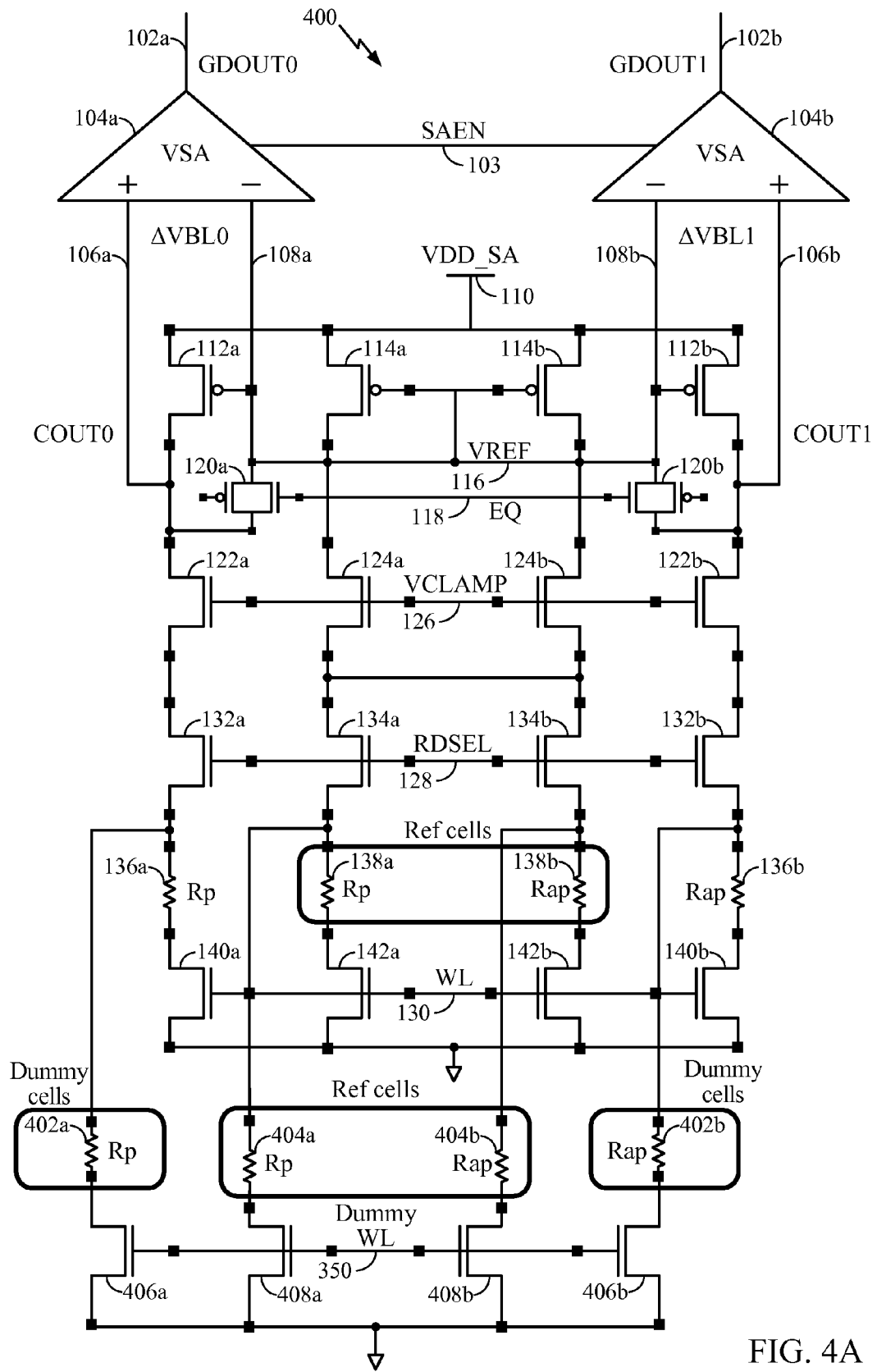
FIG. 4A illustrates a circuit diagram for an exemplary MRAM system according to disclosed aspects.

With reference to FIG. 4A, MRAM 400 is shown. MRAM 400 includes MRAM system 100 of FIG. 1, and additionally includes dummy circuitry 450. Dummy circuitry 450 includes dummy data cells 402a-b and dummy reference cells 404a-b. Dummy data cells 402a-b are configured similar to MTJ bit cells 136a-b, but the data values stored in them do not pertain to actual data stored in the MRAM. Dummy reference cells 404a-b are similar to reference cells 138a-b and they are configured with a parallel resistance Rp (logic "0") and an anti-parallel resistance Rap (logic "1") resistive elements to generate an effective resistance Rref. When dummy word line 350 is activated, NMOS transistors 406a-b and 408a-b are turned on, which creates an alternative path for current to flow through, and for initiating the settling of Vref 116.

Figure 4B:
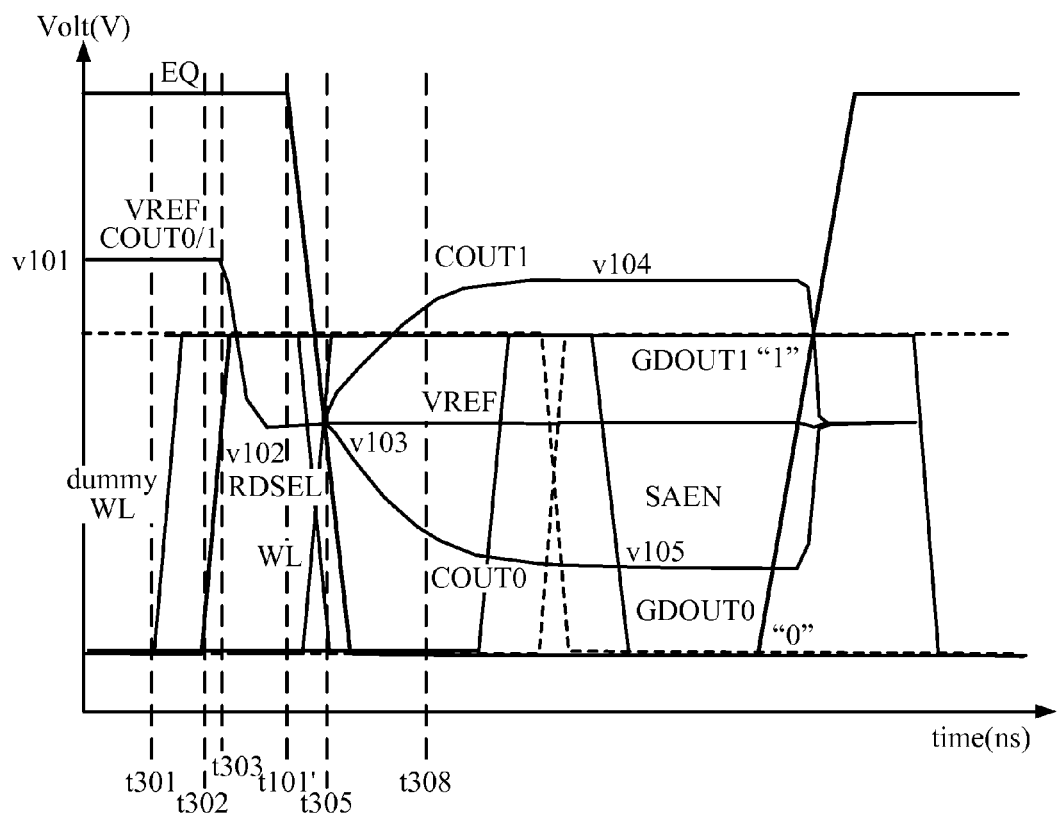
FIG. 4B illustrates timing diagrams corresponding to the exemplary MRAM system of FIG. 4A.

FIG. 4B illustrates the corresponding timing diagram for MRAM 400. In contrast to FIG. 1B, FIG. 4B reveals that dummy word line assertion occurs at time t301. The column address is made to correspond to dummy data cells 402a-b at time t302. Vref and COUT0/1 settling is initiated at time t303. Notably, times t301, t302, and t303 occur prior to time t101' when the actual word line is activated. Thus, the equalization signal is deactivated and sensing operation to generate COUT0/1 commences soon after time t101', at time t305. The outputs GDOUT0/1 are thus available by time t308. Comparing FIGS. 1B and 4B, it can be seen that time t308 is significantly lower than time t108 when the outputs are available in conventional MRAM system 100.

Figure 5:
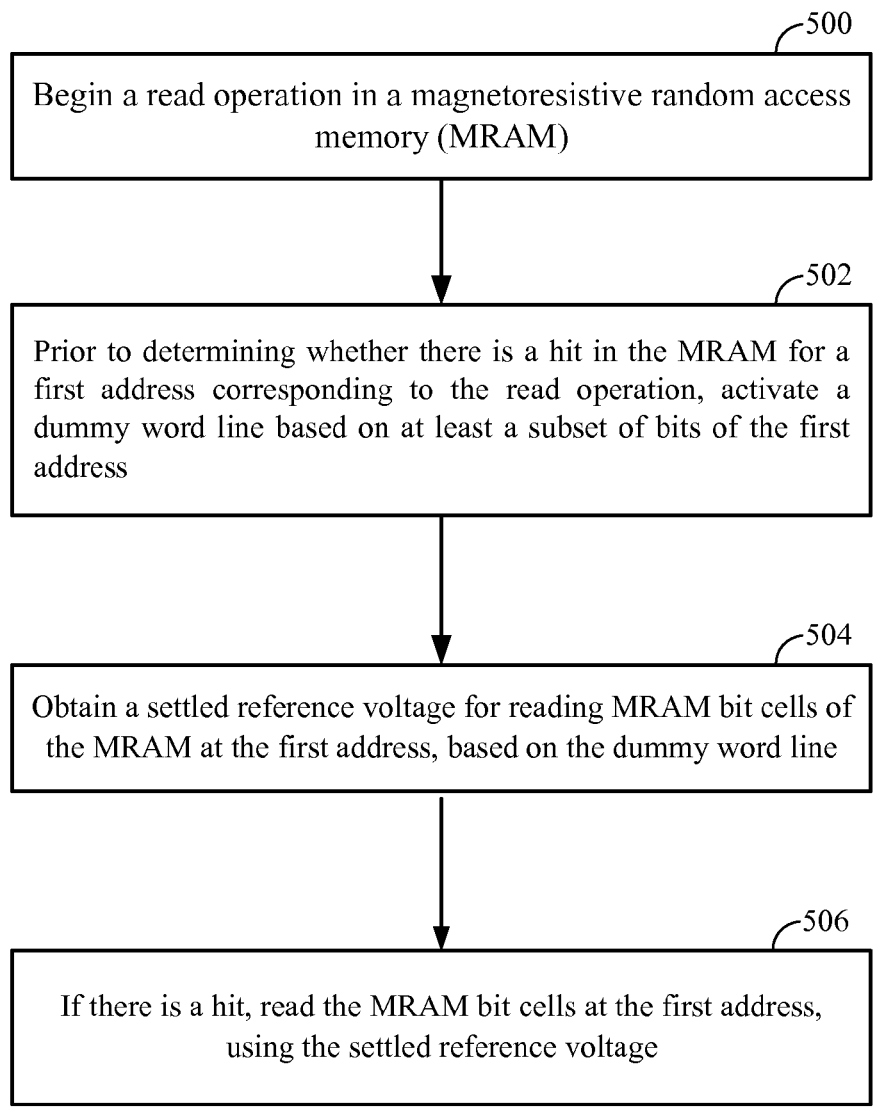
FIG. 5 illustrates a method of reading a MRAM according to exemplary aspects.

It will be appreciated that exemplary aspects include various methods for performing the processes, functions and/or algorithms disclosed herein. For example, as illustrated in FIG. 5, an exemplary aspect can include a method starting at Block 500, where a read operation on a magnetoresistive random access memory (MRAM) (e.g., 400 of FIG. 4A) is started. The method includes, prior to determining whether there is a hit in the MRAM for a first address corresponding to the read operation, activating a dummy word line (e.g., 350 at time t301 of FIG. 3C) based on at least a subset of bits (e.g., first portion of index 302b) of the first address—Block 502; obtaining a settled reference voltage (e.g., Vref 116 of FIG. 4A) for reading MRAM bit cells (e.g., 136a-b of FIG. 4A) of the MRAM at the first address, based on the dummy word line—Block 504; and if there is a hit, reading the MRAM bit cells at the first address, using the settled reference voltage—Block 506.

initiating a read operation for a first address (e.g., 302) in the MRAM—Block 500; prior to determining whether there is a hit in the MRAM for the first address: activating a dummy word line (350) based on a subset of bits (e.g., first portion of index 302b) of the first address; and initiating a settling process for a reference voltage (e.g., Vref 116 of FIG. 4A) based on dummy cells (e.g., 402a-b and 404a-b) connected to the dummy word line—Block 502; obtaining a settled reference voltage—Block 504; determining whether there is a hit (e.g., 310) in the MRAM for the first address—Block 506; and if there is a hit, activating a first word line (e.g., WL 130 of FIG. 4A) based on a row address determined from the first address, and reading MRAM bit cells (e.g., 136a-b) connected to the first word line based on the settled reference voltage—Block 508.

Figure 6:
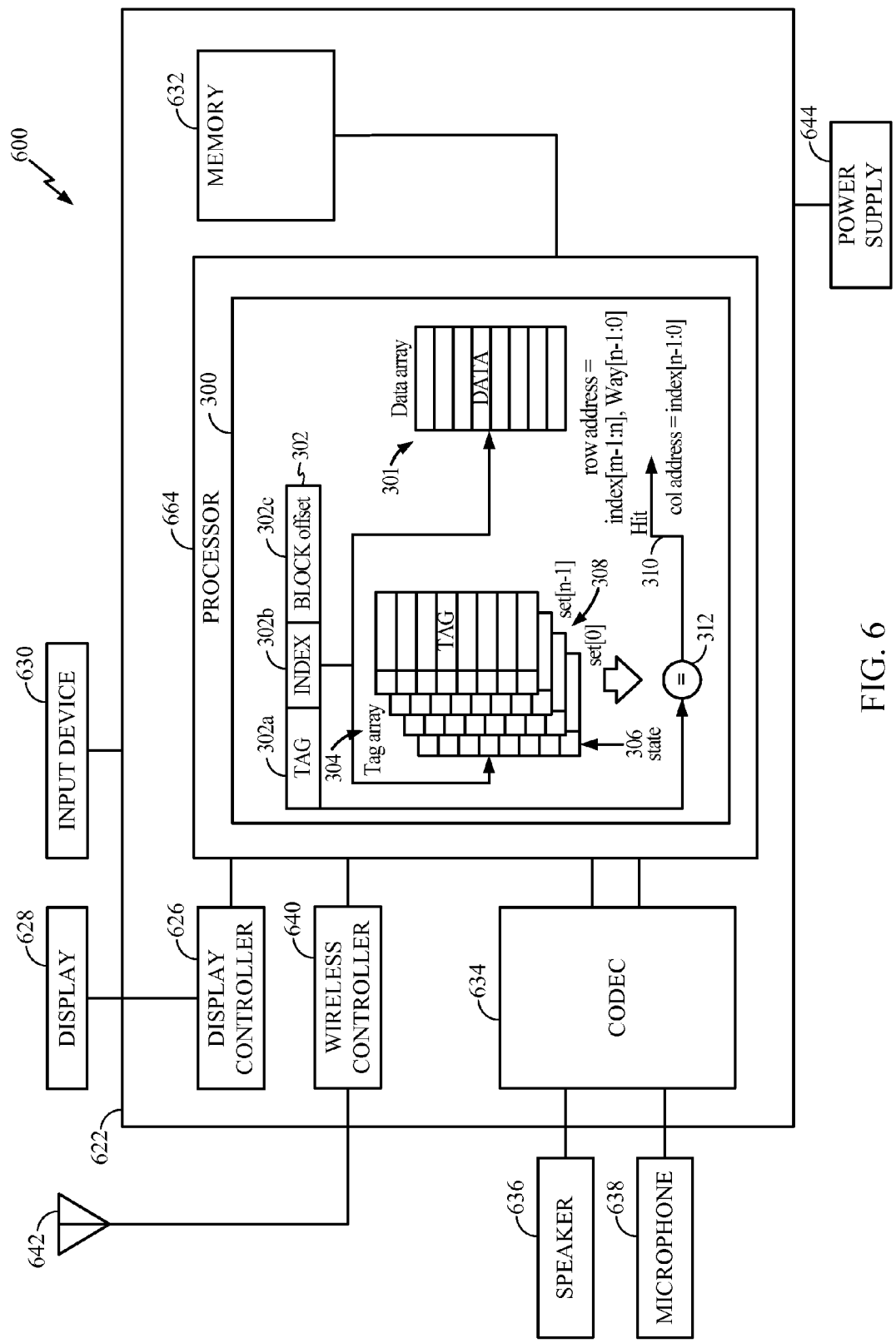
FIG. 6 illustrates a block diagram showing an exemplary wireless device in which exemplary aspects may be advantageously employed.

Referring now to FIG. 6, a block diagram of a particular illustrative embodiment of a wireless device that includes exemplary cache 300 is shown. Wireless device 600 includes processor 664 coupled to memory 632. Wireless device 600 is shown to include cache 300 of FIG. 3A, which may utilize the exemplary aspects of accelerated Vref settling using a dummy word line, as previously explained.

FIG. 6 also shows display controller 626 that is coupled to processor 664 and to display 628. Coder/decoder (CODEC) 634 (e.g., an audio and/or voice CODEC) can be coupled to processor 664. Other components, such as wireless controller 640 (which may include a modem) are also illustrated. Speaker 636 and microphone 638 can be coupled to CODEC 634. FIG. 6 also indicates that wireless controller 640 can be coupled to wireless antenna 642. In a particular embodiment, processor 664, display controller 626, memory 632, CODEC 634, and wireless controller 640 are included in a system-in-package or system-on-chip device 622.

In a particular embodiment, input device 630 and power supply 644 are coupled to the system-on-chip device 622. Moreover, in a particular embodiment, as illustrated in FIG. 6, display 628, input device 630, speaker 636, microphone 638, wireless antenna 642, and power supply 644 are external to the system-on-chip device 622. However, each of display 628, input device 630, speaker 636, microphone 638, wireless antenna 642, and power supply 644 can be coupled to a component of the system-on-chip device 622, such as an interface or a controller.

It should be noted that although FIG. 6 depicts a wireless communications device, processor 664 and memory 632 may also be integrated into a set-top box, a music player, a video player, an entertainment unit, a navigation device, a personal digital assistant (PDA), a mobile phone, a smart phone, a laptop, a fixed location data unit, or a computer, and/or a semiconductor die.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for operating a multiprocessing system with disunited private-information and shared-information caches. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of performing a read operation on a magnetoresistive random access memory (MRAM), the method comprising:
   prior to determining whether there is a hit in the MRAM for a first address corresponding to the read operation, activating a dummy word line based on at least a subset of bits of the first address;
   obtaining a settled reference voltage for reading MRAM bit cells of the MRAM at the first address, based on the dummy word line; and
   if there is a hit, reading the MRAM bit cells at the first address, using the settled reference voltage.

2. The method of claim 1, wherein the MRAM is integrated in a data array of a set-associative cache with two or more ways, and the subset of bits of the first address correspond to a first portion of an index field for accessing a tag array associated with the data array.

3. The method of claim 2, comprising determining a column address for the MRAM bit cells from a second portion of the index field.

4. The method of claim 1, wherein if there is a miss, deactivating the dummy word line and avoiding activation of a first word line coupled to the MRAM bit cells.

5. The method of claim 1, further comprising deactivating the dummy word line after a first word line coupled to the MRAM bit cells is activated for the read operation.

6. The method of claim 1, wherein the settled reference voltage is derived from dummy cells connected to the dummy word line.

7. The method of claim 6, wherein the dummy word line and the dummy cells are common to two or more rows of the MRAM.

8. An apparatus comprising:
a magnetoresistive random access memory (MRAM);
logic configured to activate a dummy word line based on at least a subset of bits of a first address corresponding to a read operation on MRAM bit cells at the first address, before it is determined whether there is a hit in the MRAM for the first address;
logic configured to obtain a settled reference voltage for the read operation on the MRAM bit cells, based on the dummy word line; and
logic configured to perform the read operation on the MRAM bit cells using the settled reference voltage if there is a hit.

9. The apparatus of claim 8, wherein the MRAM is integrated in a data array of a set-associative cache with two or more ways, and the subset of bits of the first address correspond to a first portion of an index field of a tag array associated with the data array.

10. The apparatus of claim 9, comprising logic configured to determine a column address for the MRAM bit cells from a second portion of the index field.

11. The apparatus of claim 8, comprising logic configured to deactivate the dummy word line and avoid activation of a first word line coupled to the MRAM bit cells if there is a miss.

12. The apparatus of claim 8, further comprising logic configured to deactivate the dummy word line after a first word line coupled to the MRAM bit cells is activated for the read operation.

13. The apparatus of claim 8, wherein the settled reference voltage is derived from dummy cells connected to the dummy word line.

14. The apparatus of claim 13, wherein, the dummy word line and the dummy cells are common to two or more rows of the MRAM.

15. The apparatus of claim 8 integrated in a semiconductor die.

16. The apparatus of claim 8, integrated in a device selected from the group consisting of a set-top box, music player, video player, entertainment unit, navigation device, communications device, personal digital assistant (PDA), fixed location data unit, mobile phone, and a computer.

17. A system comprising:
a magnetoresistive random access memory (MRAM);
means for activating a dummy word line based on at least a subset of bits of a first address corresponding to a read operation on MRAM bit cells at the first address, before it is determined whether there is a hit in the MRAM for the first address;
means for obtaining a settled reference voltage for the read operation on the MRAM bit cells, based on the dummy word line; and
means for performing the read operation on the MRAM bit cells using the settled reference voltage if there is a hit.

18. The system of claim 17 further comprising means for deactivating the dummy word line and avoid activation of a first word line coupled to the MRAM bit cells if there is a miss.

19. The method of claim 1, comprising activating the dummy word line based on at least the subset of bits of the first address, prior to activating a first word line coupled to the MRAM bit cells at the first address.

20. The apparatus of claim 8, comprising logic configured to activate the dummy word line based on at least the subset of bits of the first, before a first word line coupled to the MRAM bit cells at the first address is activated.

21. The system of claim 17 comprising means for activating the dummy word line based on at least the subset of bits of the first address, before a first word line coupled to the MRAM bit cells at the first address is activated.

* * * * *